United States Patent
Toba et al.

(10) Patent No.: US 6,957,956 B2
(45) Date of Patent: Oct. 25, 2005

(54) VERTICAL HEAT TREATING EQUIPMENT

(75) Inventors: Katsuya Toba, Tokyo (JP); Kiichi Takahashi, Tokyo (JP); Mitsuru Obara, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/506,688

(22) PCT Filed: Mar. 27, 2003

(86) PCT No.: PCT/JP03/03862

§ 371 (c)(1),
(2), (4) Date: Sep. 20, 2004

(87) PCT Pub. No.: WO03/085710

PCT Pub. Date: Oct. 16, 2003

(65) Prior Publication Data

US 2005/0175952 A1    Aug. 11, 2005

(30) Foreign Application Priority Data

Apr. 9, 2002  (JP)  ............................. 2002-107090

(51) Int. Cl.$^7$ ............................................. F27D 1/12
(52) U.S. Cl. ...................... 432/241; 432/237; 432/250; 118/730; 118/732
(58) Field of Search ............................. 432/241, 239, 432/237, 242, 250, 253, 258, 57; 118/725, 118/730, 732, 500; 427/248.1, 255.5

(56) References Cited

U.S. PATENT DOCUMENTS

| 5,324,540 | A | | 6/1994 | Terada |
| 5,421,892 | A | | 6/1995 | Miyagi |
| 5,908,292 | A | * | 6/1999 | Smith et al. ................. 432/197 |
| 6,235,121 | B1 | * | 5/2001 | Honma et al. ............... 118/730 |

FOREIGN PATENT DOCUMENTS

| JP | 4-026115 | 1/1992 |
| JP | 6-168904 | 6/1994 |
| JP | 2001-297987 | 10/2001 |

* cited by examiner

Primary Examiner—Gregory Wilson
(74) Attorney, Agent, or Firm—Oblon, Spivak, McClelland, Maier & Neustadt, P.C.

(57) ABSTRACT

A vertical heat-processing apparatus (1) includes a vertical heat-processing furnace (2) having a furnace port (3), a lid (5) movable up and down to open and close the furnace port, and a rotation mechanism (15) disposed on the lid to rotate a holder (13) that holds a number of target substrates (W). The rotation mechanism (15) includes a rotary shaft (16), and a support unit (19) that supports the rotary shaft (16) rotatably through a bearing (17) and sealing member (18). The rotary shaft (16) has a hollow structure with a thin wall, and is supplied with a cooling gas to flow inside and outside the rotary shaft. The support unit (19) has a cooling passage (32) surrounding an upper portion of the rotary shaft (16), and is supplied with a coolant to flow through the cooling passage.

15 Claims, 7 Drawing Sheets

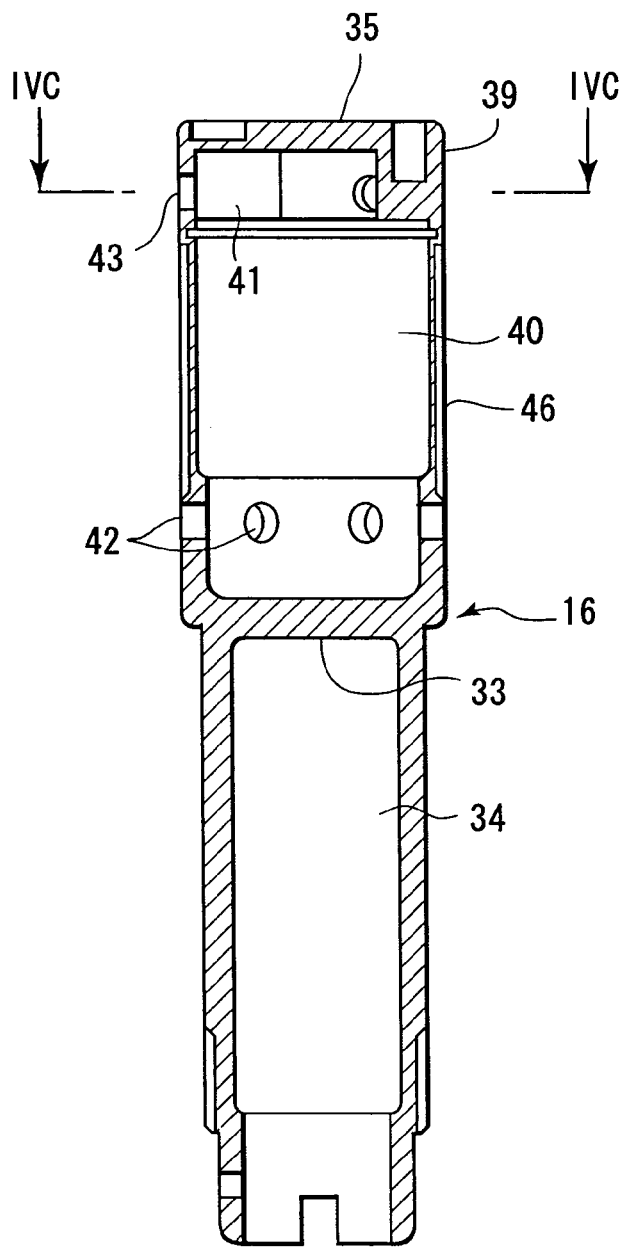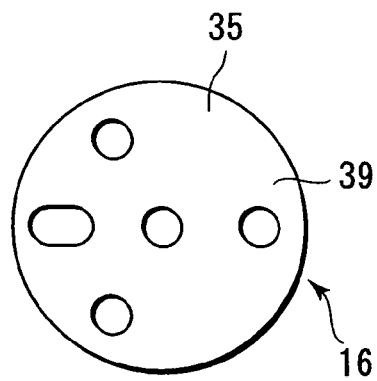
FIG. 4B
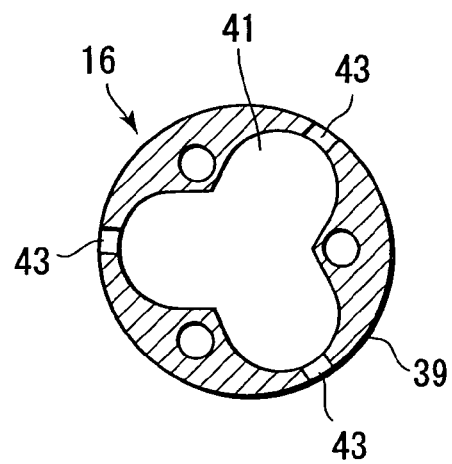
FIG. 4C
FIG. 4A

VERTICAL HEAT TREATING EQUIPMENT

TECHNICAL FIELD

The present invention relates to a vertical heat-processing apparatus, which simultaneously subjects a plurality of target substrates to a heat process. More specifically, the present invention relates to a vertical heat-processing apparatus having an improved rotation mechanism to rotate a holder that holds a plurality of target substrates, in a state where they are stacked at intervals.

In a typical case, a vertical heat-processing apparatus according to the present invention is incorporated for use in a semiconductor processing system. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or a glass substrate, by forming semiconductor layers, insulating layers, and conductive layers in predetermined patterns on the target substrate.

BACKGROUND ART

In the process of manufacturing semiconductor devices, various processing apparatuses are used for performing processes, such as film-deposition, oxidation, diffusion, reformation, annealing, and etching, on a target substrate, such as a semiconductor wafer. A vertical heat-processing apparatus for simultaneously heat-processing a number of wafers is known as a processing apparatus of this kind.

FIG. 7 is a sectional view showing a conventional rotation mechanism for rotating a wafer boat, employed in a vertical heat-processing apparatus. As shown in FIG. 7, a rotation mechanism 115 is disposed on a lid 105, which is movable up and down to open and close the furnace port (load port) of a vertical heat-processing furnace. The rotation mechanism 115 is used for rotating a wafer boat (holder), which holds a number of wafers (target substrates) thereon.

The rotation mechanism 115 includes a rotary shaft 116, and a support unit 119 that supports the rotary shaft 116 rotatably through a bearing 117 and a sealing member 118. The bottom end of the rotary shaft 116 is connected to a motor 128 through a belt 130. The top end of the rotary shaft 116 penetrates the lid 105 and is connected to a turntable 120. The turntable 120 is formed of a lower member 120a and an upper member 120b detachably attached to each other. A labyrinth structure 160 is formed between the peripheral portion of the turntable 120 and the lid 105, to prevent a process gas in the furnace from entering the clearance gap between the turntable 120 and lid 105 and leaking therefrom.

A structure for cooling the rotary shaft 116 is adopted to prevent the durability of the bearing 117 and sealing member 118 from lowering due to heat from the heat-processing furnace. In this cooling structure, an inactive gas (for example, nitrogen gas $N_2$) flows around the rotary shaft 116, and cooling water circulates through a cooling passage 132 formed near the center of the lid 105, so that the rotary shaft 116 is cooled by the inactive gas and cooling water. The inactive gas is supplied into the clearance gap between the support unit 119 and rotary shaft 116 above the sealing member 118, and flows through the clearance gap between the turntable 120 and lid 105 into the inside of the furnace. The cooling passage 132 is formed near the center of the lid 105 to have an annular shape surrounding the rotary shaft 116. The cooling water is supplied into one end of the cooling passage 132 and is exhausted from the other end.

The vertical heat-processing apparatus is designed to bear a certain high temperature of, e.g., about 1000° C. in a heat process. However, where it is used at a higher temperature of, e.g., about 1200° C. in a heat process, the conventional cooling structure cannot provide sufficient cooling. As a consequence, for example, the rotary shaft 116 and bearing 117 cling or thermally stick to each other due to thermal expansion, whereby the bearing 117 and sealing member 118 may be damaged or lowered in durability.

The rotary shaft 116 is usually made of zirconia, which is a material with a low thermal conductivity, and thus it tends to accumulate heat conducted from the inside of the furnace, and is difficult to cool. Furthermore, the clearance gap S between an axial hole formed in the lid 105 and the rotary shaft 116 is as large as, e.g., 1 mm, thus it is difficult to sufficiently cool the rotary shaft 116 from the cooling passage 132.

DISCLOSURE OF INVENTION

An object of the present invention is to provide a vertical heat-processing apparatus suitable for a high temperature heat process, which can sufficiently cool a rotary shaft to improve the durability of a bearing and a sealing member.

According to a first aspect of the present invention, there is provided a vertical heat-processing apparatus comprising a vertical heat-processing furnace having a furnace port; a lid movable up and down to open and close the furnace port; and a rotation mechanism disposed on the lid to rotate a holder that holds a number of target substrates, the rotation mechanism comprising a rotary shaft, and a support unit that supports the rotary shaft rotatably through a bearing and a sealing member, wherein the rotary shaft has a hollow structure with a thin wall, and is supplied with a cooling gas to flow inside and outside the rotary shaft, and the support unit has a cooling passage surrounding an upper portion of the rotary shaft, and is supplied with a coolant to flow through the cooling passage.

According to a second aspect of the present invention, there is provided a vertical heat-processing apparatus, which simultaneously subjects a plurality of target substrates to a heat-process, the apparatus comprising:

an airtight process chamber configured to accommodate the target substrates, and having a load port at a bottom;

a lid selectively open and close the load port of the process chamber;

a holder configured to hold the target substrates stacked at intervals within the process chamber;

a supply section configured to supply a process gas into the process chamber;

an exhaust section configured to exhaust the process chamber;

a heater configured to heat an atmosphere inside the process chamber;

an elevator configured to move the lid up and down along with the holder mounted thereon and holding the target substrates;

a rotation mechanism disposed on the lid to rotate the holder, the rotation mechanism comprising a rotary shaft having a hollow structure with a thin wall, and a support unit that supports the rotary shaft rotatably through a bearing and a sealing member, wherein an inner gas passage for cooling is formed inside the rotary shaft, while an outer gas passage for cooling is formed between the rotary shaft and the support unit; and an inactive gas supply section configured to supply an inactive gas for cooling into the inner gas passage and the outer gas passage.

The vertical heat-processing apparatus according to first and second aspects may have a structure in which the rotary shaft has an interior divided into upper and lower portions by a partition wall, near which the sealing member is disposed outside the rotary shaft, such that the cooling gas flows inside and outside the rotary shaft above the partition wall, while the lower portion of the interior of the rotary shaft below the partition wall is opened outside.

BRIEF DESCRIPTION OF DRAWINGS

FIGS. 4A, 4B, and 4C are a sectional side view, a top plan view, and a sectional view taken along a line IVC—IVC in FIG. 4A, respectively, showing the rotary shaft of the rotation mechanism shown in FIG. 2;

BEST MODE FOR CARRYING OUT THE INVENTION

Figure 1:
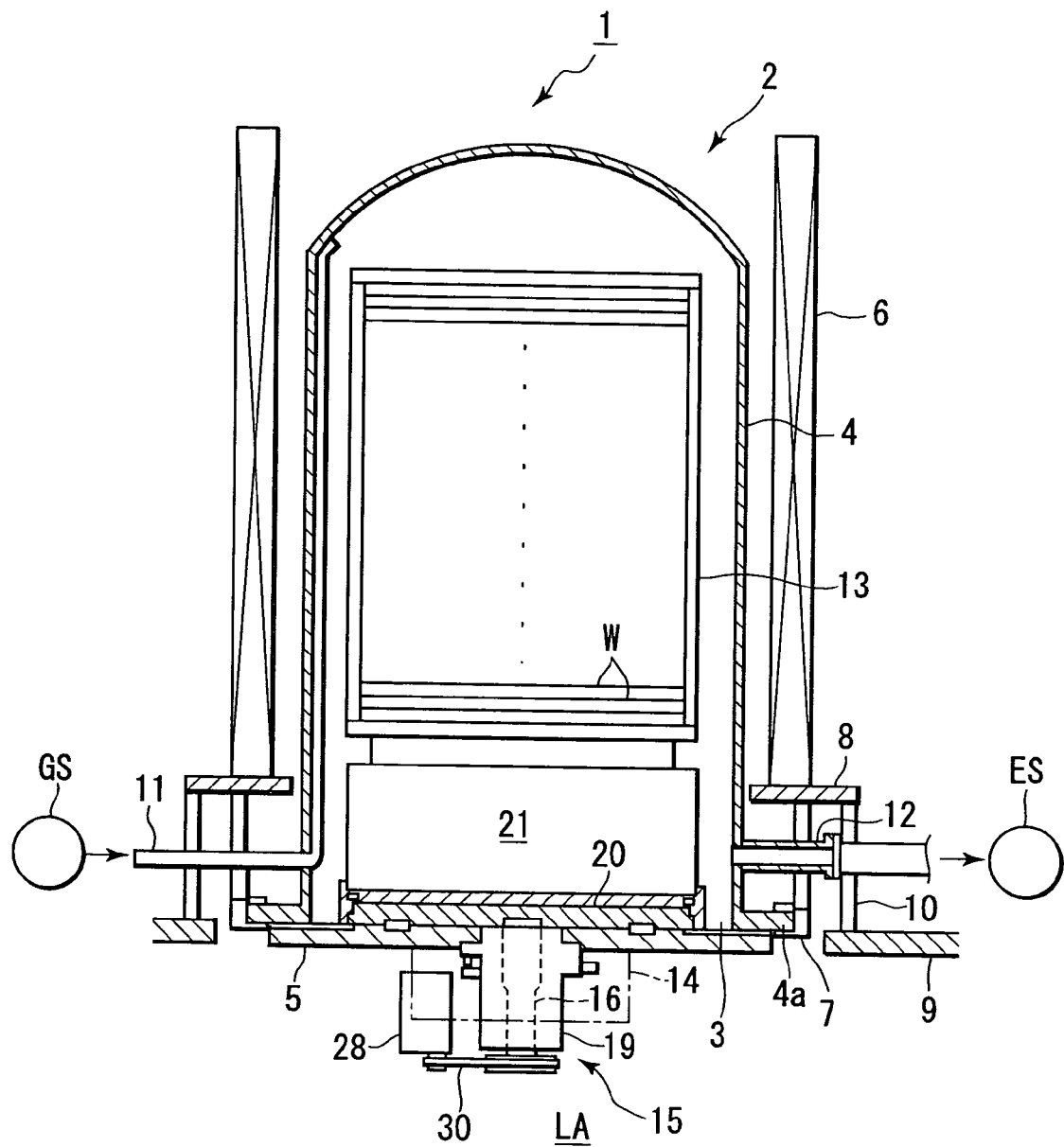
FIG. 1 is a sectional view schematically showing a vertical heat-processing apparatus according to an embodiment of the present invention.

Embodiments of the present invention will be described hereinafter with reference to the accompanying drawings. In the following description, the constituent elements having substantially the same function and arrangement are denoted by the same reference numerals, and a repetitive description will be made only when necessary.

FIG. 1 is a sectional view schematically showing a vertical heat-processing apparatus according to an embodiment of the present invention. As shown in FIG. 1, this vertical heat-processing apparatus 1 includes a vertical heat-processing furnace 2 for performing a predetermined process, such as a diffusion process, on a plurality of target substrates, such as semiconductor wafers W. The heat-processing furnace 2 includes a vertically long process chamber, such as a quartz reaction tube 4 of the single tube type, which has an opening at the bottom as a furnace port (load port) 3.

The furnace port 3 of the reaction tube (process chamber) 4 is selectively opened and closed by a lid 5 made of, e.g., a stainless steel, which is movable up and down. The lid 5 is arranged to come into contact with the lip of the furnace port 3 to airtightly close the furnace port 3. A heater 6 comprising resistance heating bodies is disposed around the reaction tube 4 and supported by a heater base 8. The heater 6 is controlled to heat the atmosphere in the reaction tube (furnace) 4 to a predetermined temperature, such as 300 to 1200° C.

The reaction tube 4 has an outward flange 4a at the bottom. The flange 4a is supported by the heater base 8 through a flange holder 7. The heater base 8 is disposed on a base plate 9 through a support frame 10. The base plate 9 is provided with an opening formed therein, into which the reaction tube 4 is inserted from below.

The reaction tube 4 is connected at the bottom to a gas supply section GS including a plurality of gas feed lines 11 for supplying process gases and an inactive purge gas into the reaction tube 4. The reaction tube 4 is also connected at the bottom to an exhaust section ES for exhausting the interior of the reaction tube 4 through an exhaust line 12.

When wafers W are processed in the reaction tube 4, they are held in a horizontal state and stacked at intervals by the wafer boat (holder) 13. The boat 13 includes a quartz boat body configured to hold a number of, e.g., 25 to 150, wafers W having a large diameter of, e.g., 300 mm.

A working area (loading area) LA is disposed below the heat-processing furnace 2, for transferring wafers W to and from the wafer boat 13. An elevating mechanism (elevator) 14 is disposed in the working area LA to move the lid 5 up and down (only the arm of the elevator 14 that supports the lid 5 is shown in FIG. 1). The boat 13 is transferred between the working area LA and reaction tube 4 by the elevator 14, while it is supported on the lid 5. In other words, the boat 13 is loaded and unloaded to and from the reaction tube 4 by the elevator 14.

Figure 2:
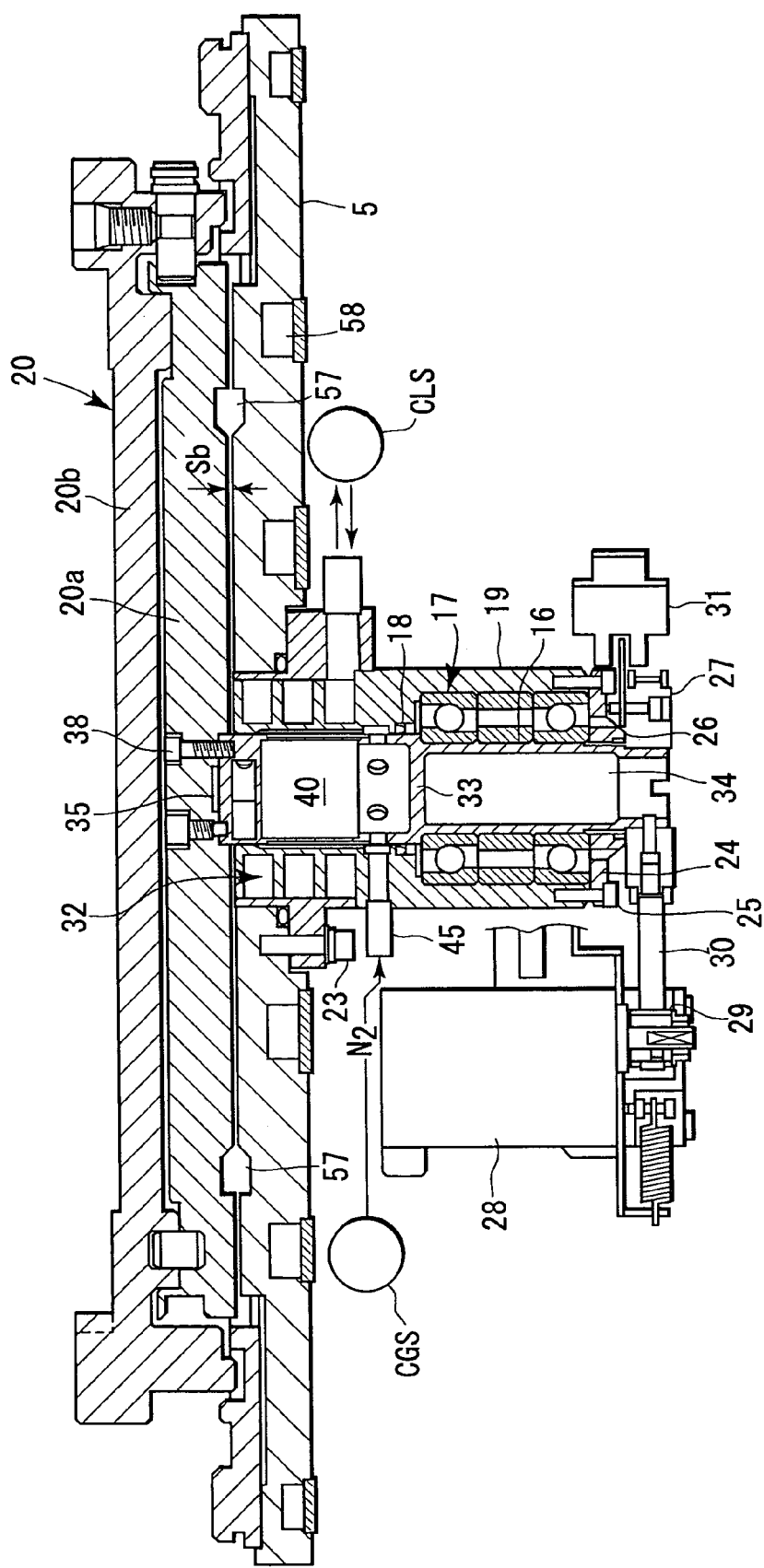
FIG. 2 is a sectional view showing a rotation mechanism for rotating a wafer boat, employed in the apparatus shown in FIG. 1.
Figure 3:
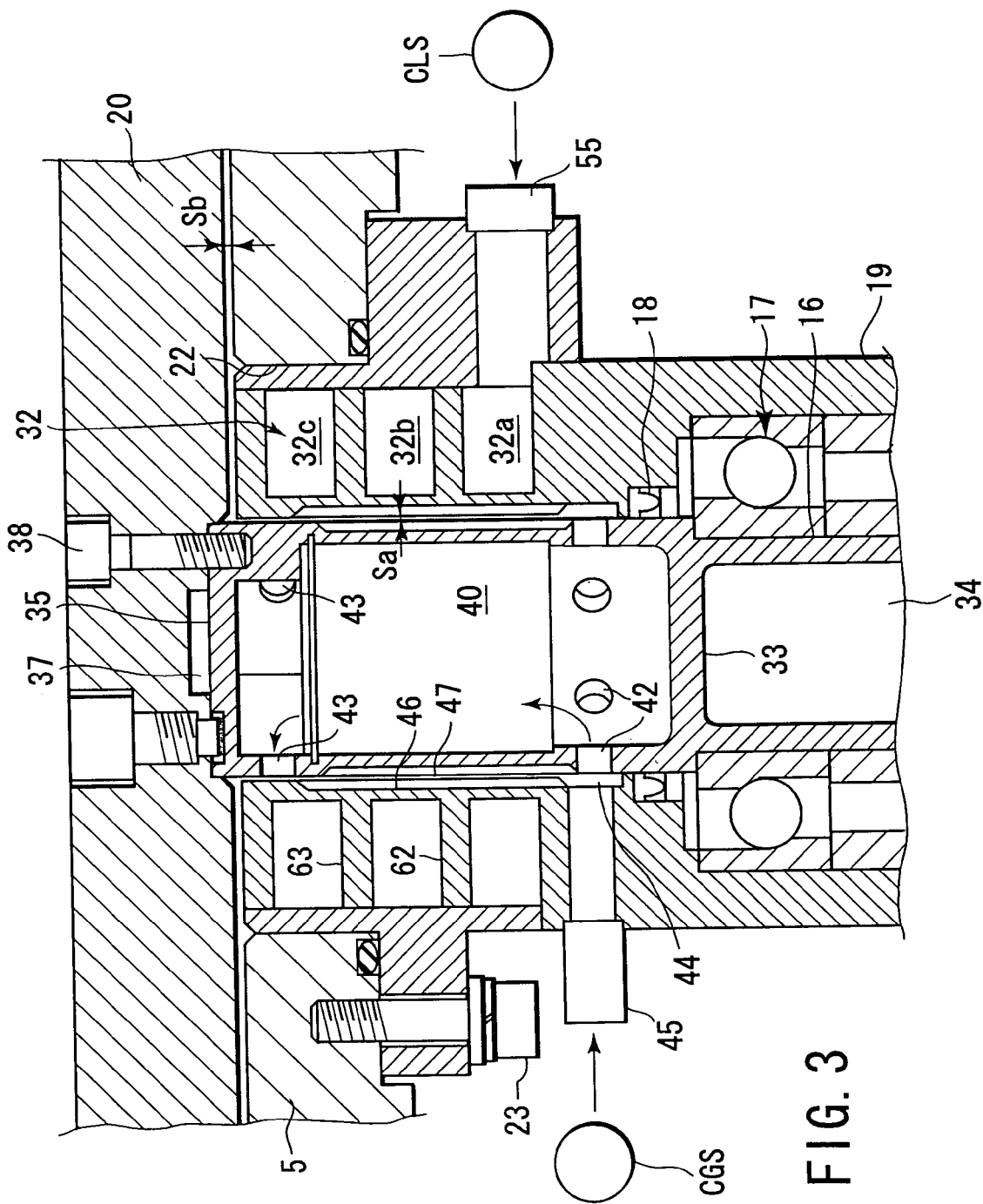
FIG. 3 is an enlarged sectional view of the rotation mechanism shown in FIG. 2.
Figure 5:
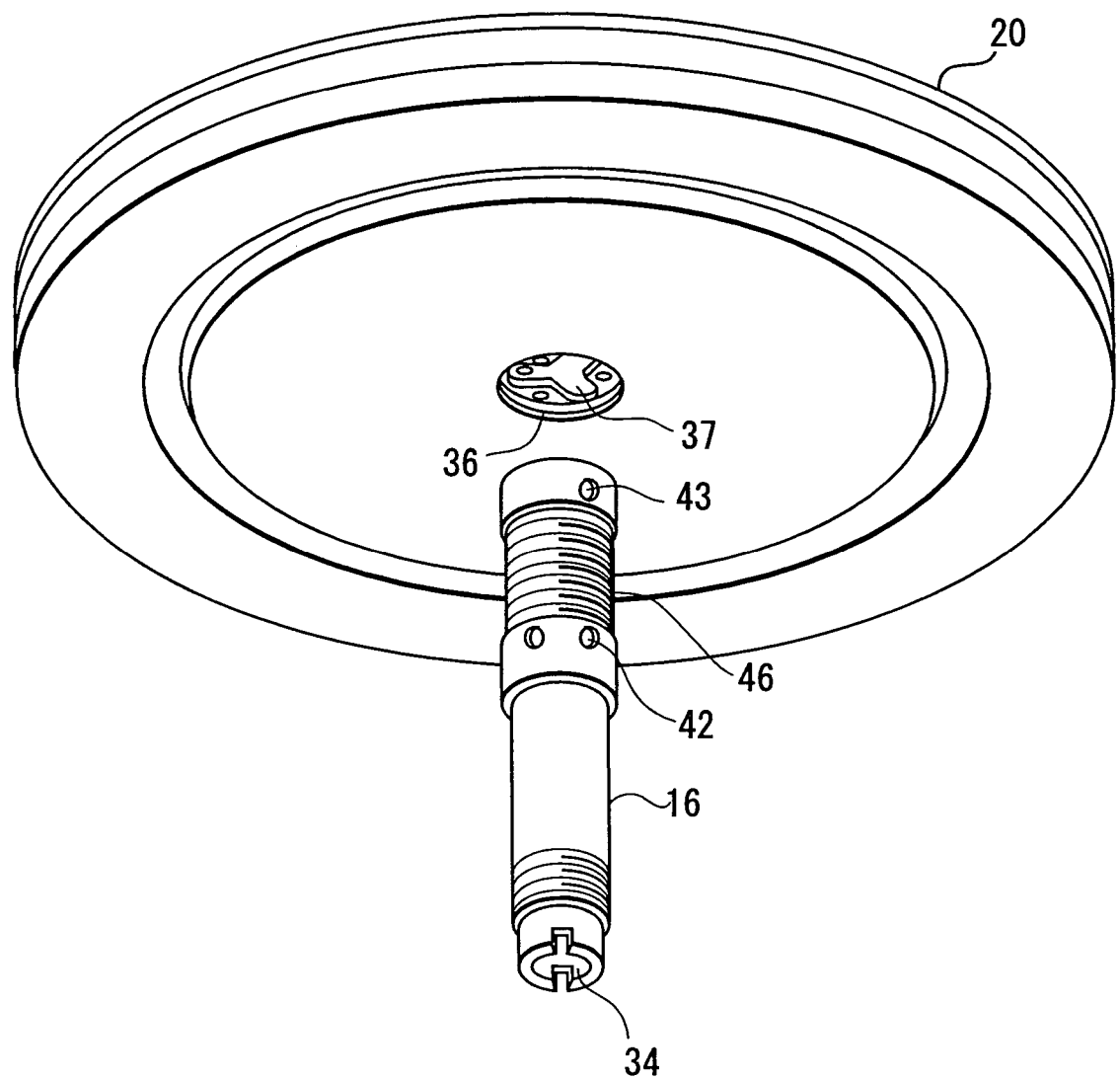
FIG. 5 is exploded perspective view showing the relationship between the turntable and rotary shaft of the rotation mechanism shown in FIG. 2.

The lid 5 is provided with a rotation mechanism 15 for rotating the wafer boat 13. FIG. 2 is a sectional view showing the rotation mechanism 15. FIG. 3 is an enlarged sectional view of the rotation mechanism 15. FIGS. 4A, 4B, and 4C are a sectional side view, a top plan view, and a sectional view taken along a line IVC—IVC in FIG. 4A, respectively, showing the rotary shaft of the rotation mechanism 15. FIG. 5 is exploded perspective view showing the relationship between the turntable and rotary shaft of the rotation mechanism 15.

The rotation mechanism 15 includes a rotary shaft 16, and a support unit (which is also referred to as a bearing housing) 19 that supports the rotary shaft 16 rotatably through a bearing 17 and a sealing member 18. The top end of the rotary shaft 16 penetrates the lid 5 from below and extends upward from the lid 5. The top end of the rotary shaft 16 is connected to a turntable 20 rotatable on the lid 5. The turntable 20 is formed of a lower member 20a and an upper member 20b detachably attached to each other. The boat 13 is mounted on the turntable 20 through an insulating cylinder 21 that works as thermally insulating means for the furnace port 3. The turntable 20 is made of, e.g., Inconel. The rotary shaft 16 and support unit 19 are preferably made of, e.g., a stainless steel having a high thermal conductivity.

The support unit 19 is formed cylindrical with a top end fitted in a fitting hole 22 of the lid 15, and is airtightly fixed to the lid 15 by screws 23. The fitting hole 22 vertically penetrates the lid 5 near the center thereof. A bearing 17, such as a ball bearing, is disposed between the rotary shaft 16 and support unit 19, at a position lower than the middle in the vertical direction. The bearing 17 is secured on an end plate 24, which is fixed to the bottom of the support unit 19 by screws 25. A nut 26 for fixing the bearing 17, such as U-nut™ having a slack preventing function, is screwed at the bottom of the rotary shaft 16.

A sealing member 18, such as Omniseal™, which is heat resistant and rotationally wear resistant, is disposed above the bearing 17 to seal the clearance gap between the rotary shaft 16 and support unit 19. The Omniseal is formed of a ring spring having a sectional U-shape covered with Teflon$^{RTM}$ coating. The sealing member 18 may be an O-ring.

A driven pulley 27 is connected to the bottom end of the rotary shaft 16 extending from the support unit 19, to rotate the rotary shaft 16. The driven pulley 27 is coupled with a driving pulley 29 by a timing belt 30 wound around them. The driving pulley 29 is connected to the rotary shaft of a motor 28 disposed on a lateral side thereof. A sensor 31 is disposed near the driven pulley 27 to detect the rotational position of the rotary shaft 16.

A structure for cooling the rotary shaft 16 is used to suppress the effects caused by heat being transmitted to the bearing 17 and sealing member 18 through the rotary shaft 16 and support unit 19 from the inside of the furnace. In this cooling structure, the rotary shaft 16 has a hollow structure with a thin wall, such that an inner gas passage for cooling is formed in the rotary shaft 16. Furthermore, an outer gas passage is formed between the rotary shaft 16 and support unit 19. The gas passages are supplied with a cooling gas or inactive gas, such as nitrogen gas $N_2$, which flows therethrough. In addition, a cooling passage 32 is formed in the support unit 19 to surround the upper portion of the rotary shaft 16, and supplied with a coolant, such as water or a cooling gas, which flows therethrough. The lid 5 is provided with a cooling passage 58 formed therein to cool the lid 5 itself.

As also shown in FIG. 4A, the interior of the rotary shaft 16 is divided into upper and lower portions by a partition wall 33. A sealing member 18 is disposed outside the rotary shaft 16 near the partition wall 33. The inner gas passage and outer gas passage are formed above the partition wall 33. The interior of the rotary shaft 16 below the partition wall 33 is opened outside, so that heat of the rotary shaft 16 is discharged outside.

A flat portion 35 is formed on the top end of the rotary shaft 16 to fix the turntable 20 thereon in a horizontal state. As also shown in FIG. 5, a shallow insertion hole 36 is formed in the bottom of the turn-table 20 near the center thereof, to insert the top end of the rotary shaft 16 therein. A recess 37 having an almost trifoliate shape is formed at the top of the insertion hole 36, to reduce the contact area between the rotary shaft 16 and turntable 20. The turntable 20 is fixed to the flat portion 35 at the top end of the rotary shaft 16 by screws 38. The recess 37 may be formed in the flat portion 35 at the top end of the rotary shaft 16.

The flat portion 35 at the top end of the rotary shaft 16 is defined by the top end of an upper part welded to the rotary shaft 16. A cavity 40 is formed in the upper side of the rotary shaft 16 by the partition wall 33 and upper part 39 of the hollow rotary shaft 16. As shown in FIG. 4C, a recess 41 having the same shape as the recess 37 of the turntable 20 is formed at the top of the cavity 40. The recess 41 is formed to reduce heat transfer to the rotary shaft 16 through the turntable 20. The upper part 39 may be disposed at the top end of the rotary shaft by a bonding means other than welding, such as closely fitting or screwing.

A plurality of, e.g., six, gas inlet holes 42 are formed in the outer wall of the rotary shaft 16, corresponding to the lower portion of the cavity 40. On the other hand, a plurality of, e.g., three, gas outlet holes 43 are formed, corresponding to the upper portion of the cavity 40 (preferably to the recess 41). A cooling gas is introduced from a gas feed port 45, and flows through the cavity 40 of the rotary shaft 16 from the inlet holes 42 to the outlet holes 43.

An annular groove 44 is formed on the inner surface of the support unit 19, corresponding to the gas inlet holes 42. The support unit 19 is provided with the single gas feed port 45, by which the annular groove 44 is supplied with an inactive gas, such as nitrogen gas, used as a cooling gas. The gas feed port 45 is connected to a gas supply section CGS for supplying nitrogen gas through a gas feed line.

A part of the nitrogen gas fed into the annular groove 44 flows up through the clearance gap Sa between the rotary shaft 16 and support unit 19. Another part of the nitrogen gas fed into the annular groove 44 flows up through the inner gas passage, whose center is the cavity 40 of the rotary shaft 16, from the gas inlet holes 42 to the gas outlet holes 43. These parts of the nitrogen gas cool the rotary shaft 16 from both inside and outside, and merge at the outside of the outlet holes 43. Then, the nitrogen gas flows through the clearance gap Sb between the bottom of the turntable 20 and the top of the lid 5, and is discharged into the furnace, i.e., into the reaction tube 4.

In order to better cool the rotary shaft 16 from the cooling passage 32, i.e., to improve the cooling effect, the clearance gap Sa between the rotary shaft 16 and support unit 19 is set to be small, at 0.1 to 2 mm, preferably at 0.2 to 0.8 mm, such as about 0.42 mm. The support unit 19 and rotary shaft 16 are provided with threads 46 and 47, respectively, formed on the opposite surfaces thereof, corresponding to the cooling passage 32, which serve as projections and/or recesses for heat-radiation. More specifically, the thread 46 on the outer surface of rotary shaft 16 is formed of, e.g., a male screw of M30×1.5. On the other hand, the thread 47 on the inner surface of the holder 19 is formed of, e.g., a female screw of M33×2. As described above, the screw-threads functions as so-called heat-radiation fins, which enhance the cooling effect on the rotary shaft 16.

Figure 6:
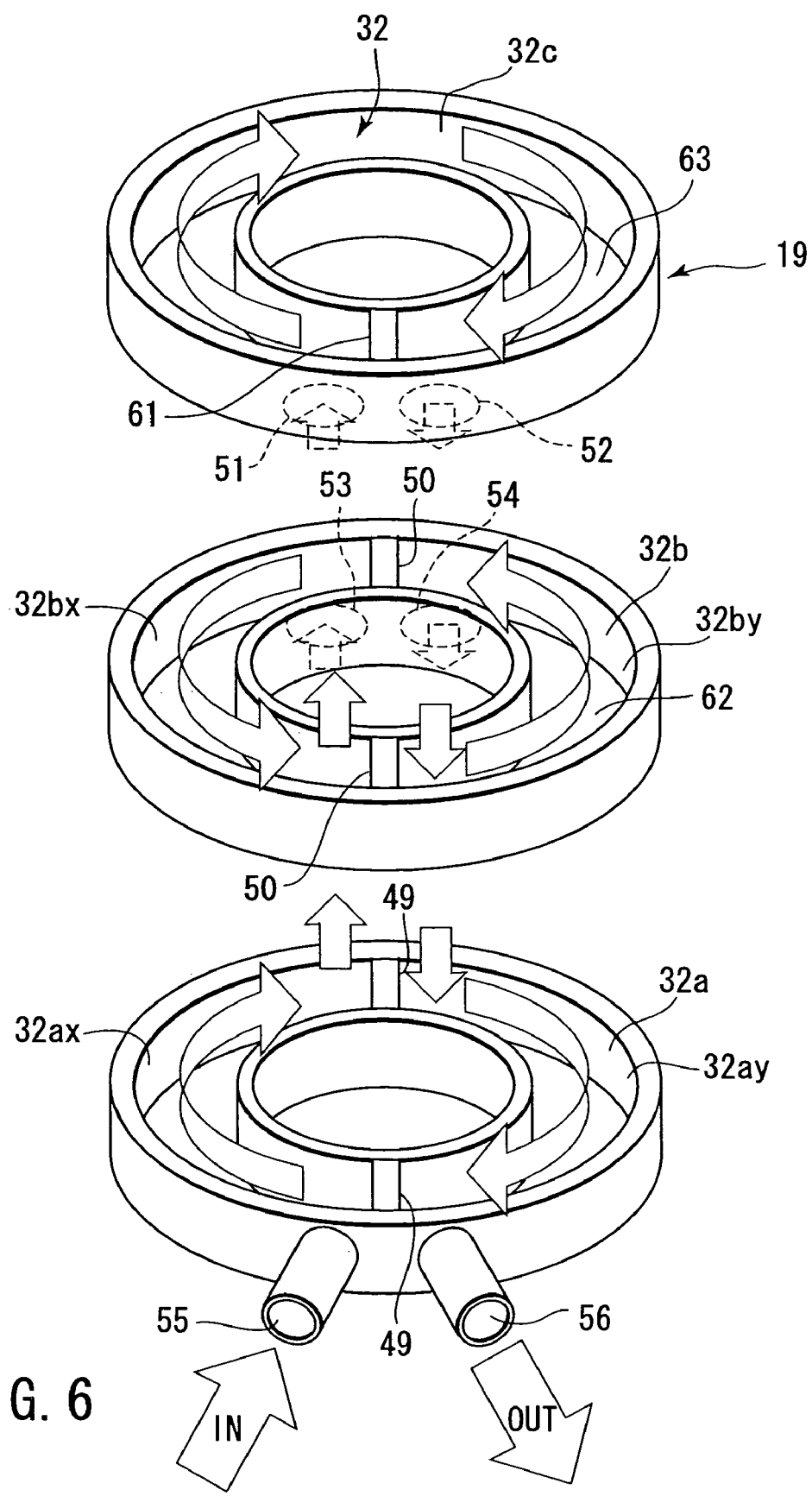
FIG. 6 is an exploded perspective view showing the cooling passage of the rotation mechanism shown in FIG. 2.
Figure 7:
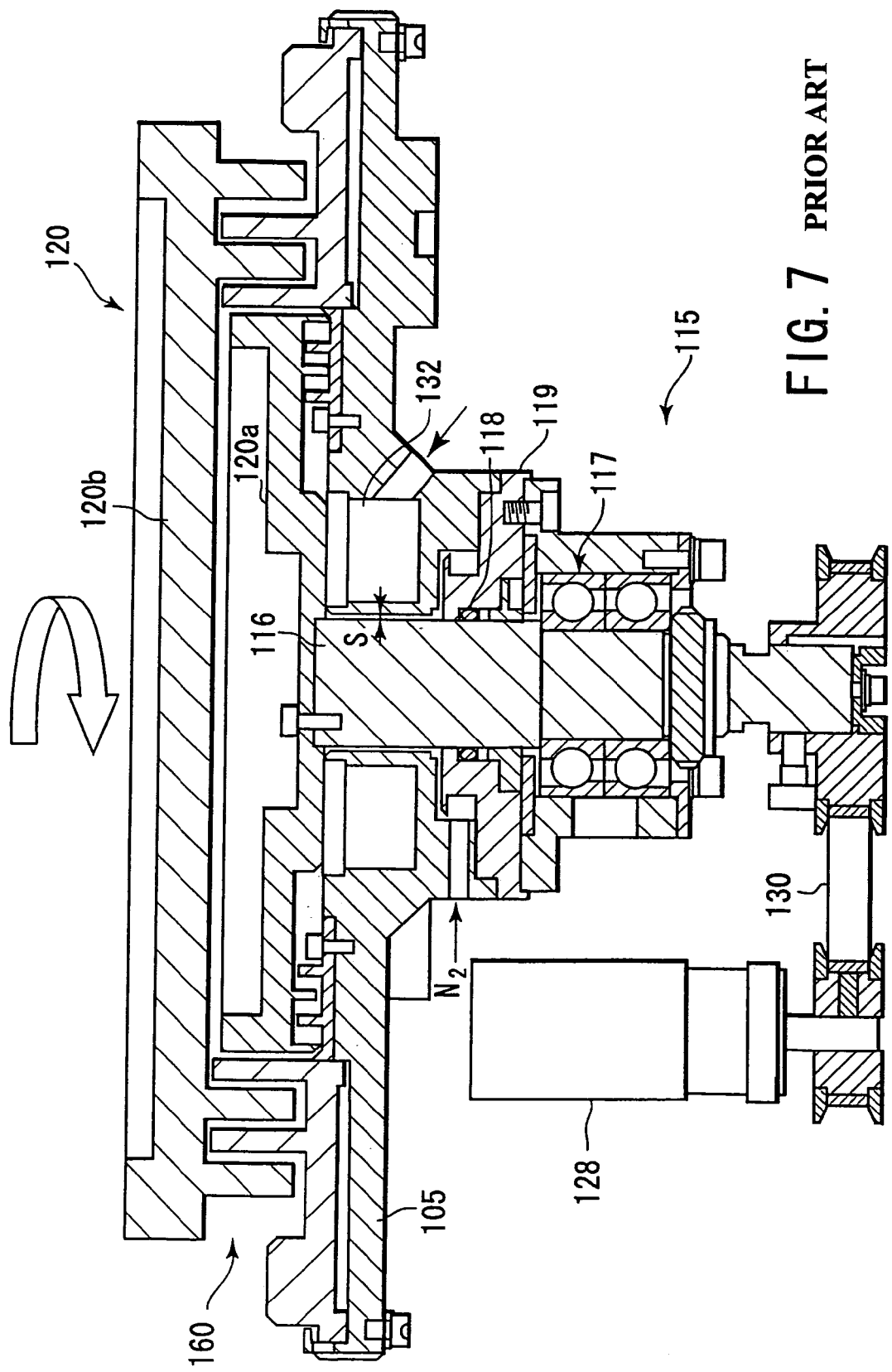
FIG. 7 is a sectional view showing a conventional rotation mechanism for rotating a wafer boat, employed in a vertical heat-processing apparatus.

On the other hand, the cooling passage 32 is formed helical around the rotary shaft 16, so that a coolant, such as cooling water, can circulate without stagnation. FIG. 6 is an exploded perspective view showing the cooling passage 32. As shown in FIG. 6 in a disassembled state, the cooling passage 32 is preferably formed of a multi-layered structure, such as a three-layered structure, for the sake of easy fabrication. Specifically, in order to constitute the cooling passage 32, the support unit 19 is provided with annular passages 32a, 32b, and 32c, stacked one on the other, in a multi-stage or multi-layered formation. For example, they consist of a lower layer, a middle layer, and an upper layer with partition members 62 and 63 respectively interposed therebetween.

Each of the passages 32a and 32b of the lower and middle layers includes two partition walls 49 or 50 one on either of the front and rear sides, to divide the passage into a left passage 32ax or 32bx and a right passage 32ay or 32by. The passage 32c of the upper layer includes one partition wall 61 on the front side, to form a C-shaped passage. The partition member 63 between the upper layer and middle layer is provided with communication holes 51 and 52 formed therein near the partition wall 61 of the upper layer. The holes 51 and 52 connect the passage 32c of the upper layer to the left and right passages 32bx and 32by of the middle layer, so that a coolant can flow therethrough. The partition member 62 between the middle layer and lower layer is provided with communication holes 53 and 54 formed therein near the rear side partition wall 50 of the middle layer. The holes 53 and 54 connect the left and right passages 32bx and 32by of the middle layer to the left and right passages 32ax and 32ay of the lower layer, so that a coolant can flow therethrough.

The lower layer is provided with a coolant (cooling water) feed port 55 and an exhaust port 56 formed near the front side partition wall 49. They are respectively connected to a feed line and an exhaust water line (return line) of a coolant supply section CLS. As indicated with arrows, cooling water (water at normal temperature) is supplied and circulated through the cooling passage 32 from the feed port 55 to the exhaust port 56.

As described above, the narrow clearance gap Sb is formed between the top of the lid 5 and the bottom of the turntable 20, to allow an inactive gas to flow from the center to the periphery. A gas buffer 57, which is annular and continuous in the angular direction, is formed between the top of the lid 5 and the bottom of the turntable 20. The gas buffer 57 is a cavity defined by a combination of annular grooves respectively formed in the top of the lid 5 and the bottom of the turntable 20. Nitrogen gas flows through the clearance gap Sb into the gas buffer 57 after it passes through the inner gas passage and outer gas passage inside and outside the rotary shaft 16. Since nitrogen gas is pooled in the gas buffer 57, a process gas from inside the furnace is prevented from leaking to a region around the rotary shaft 16.

In summary, the vertical heat-processing apparatus 1 according to this embodiment includes the rotation mechanism 15 disposed on the lid 5, which is movable up and down to open and close the furnace port 3 of a vertical heat-processing furnace 2. The rotation mechanism 15 is used for rotating the boat 13, which holds a plurality of wafer W thereon. The rotation mechanism 15 includes the rotary shaft 16, and the support unit 19 that supports the rotary shaft 16 rotatably through the bearing 17 and the sealing member 18. The rotary shaft 16 has a hollow structure with a thin wall, such that a cooling gas can flow inside and outside the rotary shaft 16. On the other hand, the support unit 19 is provided with the cooling passage 32 surrounding the upper portion of the rotary shaft 16, and supplied with a coolant, such as water, flowing therethrough. This arrangement makes it possible to sufficiently cool the rotary shaft 16, so as to improve the durability of the bearing 17 and sealing member 18. As a consequence, this arrangement can be applied to a heat process performed at a high temperature of, e.g., about 1200° C.

The interior of the rotary shaft 16 is divided into upper and lower portions by the partition wall 33, near which the sealing member 18 is disposed outside the rotary shaft 16. A cooling gas, such as nitrogen gas, flows inside and outside the rotary shaft 16 above the partition wall 33. The interior of the rotary shaft 16 below the partition wall 33 is opened outside. This arrangement also makes it possible to sufficiently cool the rotary shaft 16.

The clearance gap Sa between the rotary shaft 16 and support unit 19 is set small. The support unit 19 and rotary shaft 16 are provided with the threads 46 and 47, respectively, formed on the opposite surfaces thereof, which serve as projections and/or recesses for heat-radiation. This arrangement makes it possible to sufficiently cool the rotary shaft 16 by the cooling passage 32.

The cooling passage 32 is formed helical around the rotary shaft 16. This arrangement allows cooling water to circulate without stagnation, and also allows the rotary shaft 16 and support unit 19 to be extensively cooled in the longitudinal direction of the rotary shaft 16. The cooling passage 32 comprises a plurality of stages separated in the vertical direction by the partition members 62 and 63, in which the communication holes 51, 52, 53, and 54 are formed to allow a coolant to pass therethrough. This arrangement allows the helical cooling passage 32 to be readily fabricated.

The top end of the rotary shaft 16 is provided with the flat portion 35 to which the turntable 20 is fixed. At least one of the flat portion 35 and turntable 20 is provided with the recess 37 formed therein to reduce the contact area therebetween. This arrangement can suppress the heat conduction from the turntable 20 to the rotary shaft 16.

The turntable 20 connected to the top end of the rotary shaft 16 can rotate on the lid 5. Between the top of the lid 5 and the bottom of the turntable 20 is the clearance gap Sb for an inactive gas to flow from the center to the periphery, and the annular gas buffer 57 for pooling the inactive gas. This arrangement can prevent a process gas from leaking from the inside of the furnace, with a simple structure. Since this obviates the need for a complex labyrinth structure, the cost can be reduced.

The present invention is not limited to the embodiment described above, but can accept various types of modifications and changes within the spirit of the present invention. For example, the wafer boat 13 may be formed of a material other than quartz, such as silicon carbide or poly-crystalline silicon (Si). The reaction tube 4 may be formed of a double-tube structure having inner and outer tubes. The cooling gas is preferably an inactive gas, but may be a gas other than an inactive gas. The coolant is preferably water, but may be a liquid or fluid other than water.

The vertical heat-processing apparatus according to the embodiment described above is an only an applicable example of the present invention. The present invention may be similarly applied to a vertical heat-processing apparatus of another type. For example, the vertical heat-processing apparatus may be configured to perform a process other than diffusion, such as CVD (including pressure-reduced type), oxidation, or annealing. The embodiment described above takes a semiconductor wafer as an example of a target substrate, but the present invention may be applied to an apparatus for processing another substrate, such as an LCD substrate.

What is claimed is:

1. A vertical heat-processing apparatus comprising a vertical heat-processing furnace having a furnace port; a lid movable up and down to open and close the furnace port; and a rotation mechanism disposed on the lid to rotate a holder that holds a number of target substrates,
the rotation mechanism comprising a rotary shaft, and a support unit that supports the rotary shaft rotatably through a bearing and a sealing member, wherein the rotary shaft has a hollow structure with a thin wall, and is supplied with a cooling gas to flow inside and outside the rotary shaft, and the support unit has a cooling passage surrounding an upper portion of the rotary shaft, and is supplied with a coolant to flow through the cooling passage.

2. The vertical heat-processing apparatus according to claim 1, wherein the rotary shaft has an interior divided into upper and lower portions by a partition wall, near which the sealing member is disposed outside the rotary shaft, such that the cooling gas flows inside and outside the rotary shaft above the partition wall, while the lower portion of the interior of the rotary shaft below the partition wall is opened outside.

3. The vertical heat-processing apparatus according to claim 1, wherein a clearance gap between the rotary shaft and the support unit is set small, and at least one of opposite surfaces of the support unit and the rotary shaft is provided with recesses or projections for heat-radiation.

4. The vertical heat-processing apparatus according to claim 1, wherein the cooling passage is helical.

5. The vertical heat-processing apparatus according to claim 1, wherein the cooling passage comprises a plurality of stages separated in a vertical direction by a partition member, in which communication holes are formed to allow a coolant to pass therethrough.

6. The vertical heat-processing apparatus according to claim 1, wherein the rotary shaft has a top end provided with a flat portion to which a turntable is fixed, and at least one of the flat portion and the turntable is provided with a recess formed therein to reduce an contact area therebetween.

7. The vertical heat-processing apparatus according to claim 1, wherein a turntable is connected to a top end of the rotary shaft and is rotatable on the lid, such that between a top of the lid and a bottom of the turntable is a clearance gap for an inactive gas to flow from a center to a periphery, and an annular gas buffer for pooling the inactive gas.

8. A vertical heat-processing apparatus, which simultaneously subjects a plurality of target substrates to a heat-process, the apparatus comprising:
an airtight process chamber configured to accommodate the target substrates, and having a load port at a bottom;
a lid selectively open and close the load port of the process chamber;
a holder configured to hold the target substrates stacked at intervals within the process chamber;
a supply section configured to supply a process gas into the process chamber;
an exhaust section configured to exhaust the process chamber;
a heater configured to heat an atmosphere inside the process chamber;
an elevator configured to move the lid up and down along with the holder mounted thereon and holding the target substrates;
a rotation mechanism disposed on the lid to rotate the holder, the rotation mechanism comprising a rotary shaft having a hollow structure with a thin wall, and a support unit that supports the rotary shaft rotatably through a bearing and a sealing member, wherein an inner gas passage for cooling is formed inside the rotary shaft, while an outer gas passage for cooling is formed between the rotary shaft and the support unit; and
an inactive gas supply section configured to supply an inactive gas for cooling into the inner gas passage and the outer gas passage.

9. The vertical heat-processing apparatus according to claim 8, wherein the rotary shaft has an interior divided into upper and lower portions by a partition wall, near which the sealing member is disposed outside the rotary shaft, such that the inner gas passage and the outer gas passage are formed above the partition wall, while the lower portion of the interior of the rotary shaft below the partition wall is opened outside.

10. The vertical heat-processing apparatus according to claim 8, wherein, within a region where the outer gas passage is formed, the rotary shaft is provided with projections or recesses for heat-radiation formed on an outer surface.

11. The vertical heat-processing apparatus according to claim 8, wherein the rotation mechanism further comprises a turntable connected to a top end of the rotary shaft, such that the turntable and the lid face each other between which a small clearance gap and an annular gas buffer connected to the small clearance gap are interposed, and wherein the rotary shaft is arranged such that the inactive gas passes through the inner gas passage and the outer gas passage, and then flows through the small clearance gap into the gas buffer.

12. The vertical heat-processing apparatus according to claim 8, further comprising a cooling passage formed in the support unit around the outer gas passage to allow a coolant to flow therethrough, and a coolant supply section configured to supply the coolant into the cooling passage.

13. The vertical heat-processing apparatus according to claim 12, wherein the cooling passage is helical.

14. The vertical heat-processing apparatus according to claim 12, wherein the cooling passage comprises a plurality of stages separated in a vertical direction by a partition member, in which communication holes are formed to allow a coolant to pass therethrough.

15. The vertical heat-processing apparatus according to claim 12, within a region where the cooling passage is formed, at least one of opposite surfaces of the rotary shaft and the support unit is provided with projections or recesses for heat-radiation.

* * * * *